Jan. 11, 1955 H. G. MILLER ET AL 2,699,504
AUTOMATIC TUNING DEVICE
Filed June 28, 1952
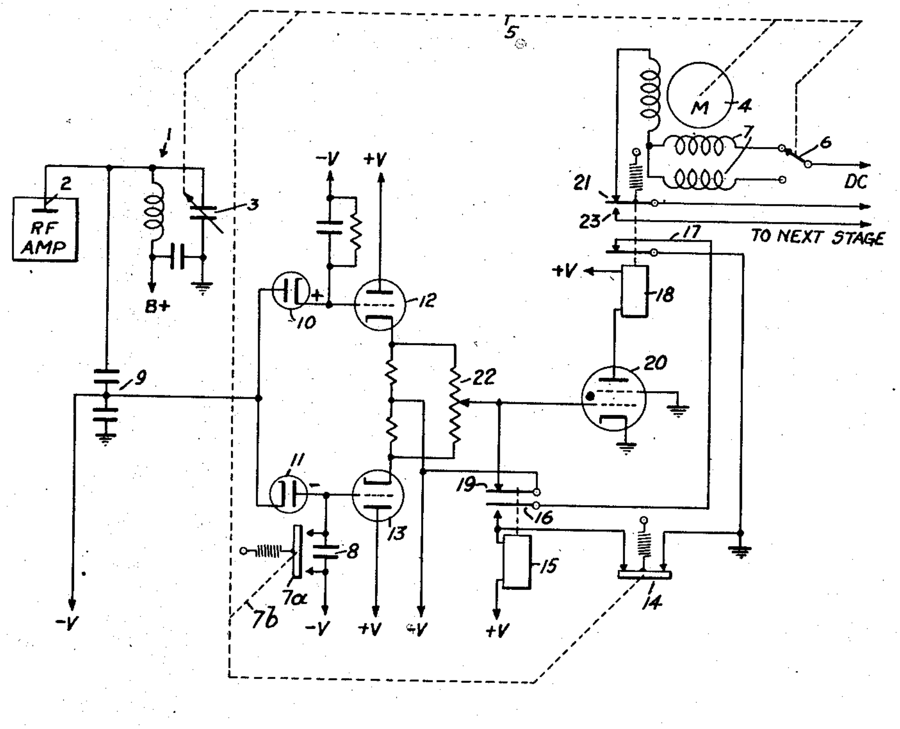
INVENTORS
HORACE G. MILLER
JEROME STILLMAN
BY Percy P. Lantzy
ATTORNEY 2,699,504

AUTOMATIC TUNING DEVICE

Horace G. Miller, Belleville, N. J., and Jerome Stillman, Brooklyn, N. Y., assignors to International Telephone and Telegraph Corporation, a corporation of Maryland Application June 28, 1952, Serial No. 296,106

7 Claims. (Cl. 250—40)

This invention relates to automatic tuning devices and more particularly to apparatus for automatically tuning an R.-F. amplifier stage to a condition of resonance for an input signal of a given frequency.

In order to operate a radio transmitter efficiently, various stages of the transmitter must be adjusted so that they are resonant at the operating frequency. It is desirable to tune these stages to a resonant condition quickly, efficiently, and accurately. In copending application of J. Stillman, Serial No. 296,105, filed June 28, 1952, assigned to the same assignee as this application, an automatic tuner is disclosed wherein a variable tuning condenser contained in the plate circuit of an R.-F. stage to be tuned is driven by a motor through its entire range to determine and store the maximum signal amplitude obtainable. The motor then tunes the condenser back through the tuning band until a signal of the same maximum amplitude as that recorded is reached, at which time the driving motor is stopped, halting the variable tuning condenser at the position which provides the desired resonant condition for the input signal frequency. The present invention comprises an improved version of the automatic tuner of the aforesaid copending application.

One of the objects of this invention, therefore, is to provide a new and improved automatic tuning device for radio systems which will tune a tank circuit to the resonant frequency of the input signal.

Another object of this invention is to provide an automatic tuning device for an R.-F. stage in a radio transmitter which is more accurate and efficient than the devices heretofore known.

A feature of this invention is the use of a driving motor coupled to the tuning condenser of an amplifier stage which will vary the tank circuit over the frequency range of the tuning condenser until the stage is aligned and in a resonant condition in respect to the frequency of the input wave to the amplifier.

The above-mentioned and other features and objects of this invention will become more apparent by reference to the following description taken in conjunction with the accompanying drawing, in which the figure of this invention is a schematic diagram of the automatic tuning device of this invention.

Referring to the figure of the drawing, an automatic tuning device in accordance with the principles of this invention is shown wherein a tank circuit 1 is coupled to the plate circuit of an R.-F. amplifier stage 2. A variable tuning condenser 3 varies the resonant condition of tank circuit 1 over a given frequency range encompassing the frequency of the input signal to the R.-F. stage. A motor 4 mechanically drives variable tuning condenser 3 through mechanical coupling 5 over its entire tuning range. As variable tuning condenser 3 reaches the limit of its rotation, reversing switch 6 is operated automatically to couple the input energy to the field coil 7 of motor 4 in the opposite direction causing motor 4 to reverse its direction of rotation which results in variable condenser 3 rescanning the frequency range. In order to tune the tank circuit 1 to a resonant condition in relation to the input signal of R.-F. amplifier 2, the variable tuning condenser 3 must operate through three scanning cycles. At the commencement of the tuning operation, the variable condenser 3 is usually at some intermediate position, and during scanning cycle #1 the motor 4 drives the variable condenser 3 to one of its extreme conditions of tuning. As the limit or rotation of variable condenser 3 is reached, switch 7*a*, coupled by gearing 7*b* to the mechanical coupler 5, is closed removing any charge on condenser 8. After condenser 8 has its charge removed and the variable condenser 3 is at the limit of its first scan, switch 7*a* is opened.

During scan #2, the motor-driven condenser 3 is driven from one extreme condition of tuning to the other, thus in effect tuning the tank circuit 1 over its entire frequency range. A portion of the R.-F. output of plate circuit 2 is coupled through voltage divider 9 to rectifiers 10 and 11, rectifier 10 passing the positive portion of the R.-F. output of voltage divider 9 and rectifier 11 passing the negative portion. The rectified positive and negative portions of the R.-F. energy are coupled to the grids of triodes 12 and 13. The time constants of rectifiers 10 and 11 are small compared to the time necessary for condenser 3 to be driven through one scan so that the positive D.-C. bias voltage on the grid of triode 12 is proportional to the instantaneous value of the R.-F. energy coupled to the amplifier stage 2 during the scan of condenser 3. The negative D.-C. bias voltage on the grid of triode 13 will reach and maintain the maximum value obtained when the tank circuit 1 is resonant to the input frequency because of the recording condenser 8 which is coupled to both the grid and the rectifier 11.

At the end of the second scan of variable tuning condenser 3, switch 14, coupled to mechanical gearing 5, is momentarily closed, energizing relay coil 15. As current flows in relay coil 15, it causes contacts 16 to close. When contacts 16 are closed, an alternate path to ground is provided for relay coil 15 through contacts 17 of relay 18, which are normally closed, so that when switch 14 is opened at the start of scan #3, relay 15 will remain energized as long as contacts 17 remain closed. Contacts 19 of relay 15, which are in a closed position when relay 15 is de-energized, apply a negative D.-C. bias to the grid of a gas filled electron discharge device 20. Contacts 19 are opened by the momentary closing of switch 14 and remain opened during scan #3 of variable tuning condenser 3 due to the alternate path to ground provided for relay coil 15 by contacts 17. This removes the fixed negative bias from the grid of the gas filled electron device 20 making the grid bias dependent on the action of the cathodes of tubes 12 and 13.

During scan #3 the grid of electron discharge device 13 maintains the maximum negative bias of the previous scan stored on recording condenser 8 while the grid of tube 12 varies its positive bias according to the relative value of the incoming frequency determined by the tuning of circuit 1. The grid of tube 13 is more negative than the grid of tube 12 is positive at all positions of tuning condenser 3 except that position which will cause tank circuit 1 to be in a resonant condition for the incoming signal. This unbalance keeps the grid of tube 20 negative with respect to ground, preventing the gas filled device 20 from firing. As motor 4 drives condenser 3 to tune the tank circuit 1 during the third scan, the positive bias on the grid of tube 12 increases until at resonance the two biases on the grids of tubes 12 and 13 are equal and opposite. When this condition of equilibrium is reached, the bias on the grid of gas filled device 20 becomes zero causing tube 20 to fire which results in the closing of contacts 17 of relay 18 and the opening of contacts 21 which remove the source of energy from the field coils 7 of motor 4 thereby halting the motor and causing the tuning condenser to remain in the position of resonance. The firing of tube 20 also causes the opening of contacts 16 and 19 of relay 15 because of the opening of contacts 17 in preparation for any new tuning operation of the device.

Since the motor 4 may be caused, due to its inertia, to drive condenser 3 past the condition of resonance, an adjustment may be made in potentiometer 22 so that tube 20 will be caused to fire just prior to a condition of equilibrium, thus compensating for the inertia of motor 4. In addition, when tube 20 fires, provision may be made for relay 18 to close a set of contacts 23 which will cause a signal to be transmitted to the next tuning stage to start its cycle of operation, thus allowing for successive operations of a plurality of tuning stages.

While we have described above the principles of our invention in connection with specific apparatus, it is to be clearly understood that this description is made only by way of example and not as a limitation to the scope of our invention as set forth in the objects thereof and in the accompanying claims.

We claim:

1. An automatic tuner for a tank circuit having an adjustable impedance element comprising means for actuating said adjustable impedance element through its entire range of adjustment, means to rectify positively and negatively a portion of the output of said tank circuit, means to store the maximum negative voltage obtained during an adjustment of said adjustable impedance element, means to cause said actuating means to initiate a second adjustment of said impedance element, a pair of electron discharge devices, one coupled to receive the positive rectified energy and the other coupled to receive the negative rectified energy, and means controlled by the output of said plurality of electron discharge devices to halt said actuating means when the positive voltage output of said rectifier means during said second adjustment equals said maximum stored voltage.

2. A tuner according to claim 1, wherein the means for halting said actuating means includes a potentiometer whereby the inertia of said actuating means may be compensated for in halting said actuating means.

3. A tuner according to claim 1, wherein said means to halt said actuating means further includes means to control the tuning of a subsequent stage.

4. An automatic tuner for a tank circuit having an adjustable impedance element comprising means for actuating said adjustable impedance element through the entire range of adjustment, means to rectify positively and negatively a portion of the output of said tank circuit, a pair of electron discharge devices each having a cathode, anode, and grid, means to couple the output of said rectifying means to the grids of said electron discharge devices, means coupled to the grid of one of said electron discharge devices to store the maximum negative voltage reached during an adjustment of said adjustable impedance element, means to cause said actuating means to initiate a second adjustment of said impedance element, means controlled by the output of said electron discharge devices to halt said actuating means when the positive voltage output of said rectifier means during said second adjustment equals said maximum stored voltage.

5. A tuner according to claim 4, wherein said means controlled by the output of said electron discharge devices includes a potentiometer coupling together electrodes of said electron discharge devices and a gas filled electron discharge device having a control electrode coupled to the output of said potentiometer whereby said gas filled device will conduct when said positive voltage output equals said stored maximum negative voltage.

6. An automatic tuner for a tank circuit having an adjustable impedance element comprising means for actuating said adjustable impedance element through the entire range of adjustment, means to rectify positively and negatively a portion of the output of said tank circuit, a pair of electron discharge devices each having a cathode, anode, and grid, means to couple the output of said rectifying means to the grids of said electron discharge devices, means coupled to the grid of one of said electron discharge devices to store the maximum negative voltage reached during an adjustment of said adjustable impedance element, potentiometer means coupled to the cathodes of said electron discharge devices, means coupled to said actuating means to initiate a second adjustment of said impedance element, a gas filled electron discharge device having a control electrode coupled to the output of said potentiometer means whereby said gas filled electron discharge device conducts when the positive voltage output of said rectifier means during said second adjustment equals said maximum stored voltage, and means to halt said actuating means when said gas filled electron discharge device conducts.

7. An automatic tuner for a tank circuit having an adjustable impedance element comprising a motor, a mechanical gearing system to drive said adjustable impedance element through its entire range of adjustment responsive to said motor, means to rectify positively and negatively a portion of the output of said tank circuit, a pair of electron discharge devices, each having a cathode, anode, and grid, the grids of said electron discharge devices being coupled to the output of said rectifying means, a capacitor coupled to the grid of one of said electron discharge devices to store the maximum negative voltage reached during an adjustment of said adjustable impedance element, potentiometer means coupled to the cathode of said electron discharge devices, means responsive to said gearing system to cause said motor to initiate a second adjustment of said impedance element, a gas filled electron discharge device having a control electrode coupled to the output of said potentiometer whereby said gas filled electron discharge device will conduct when the rectified positive voltage output equals said stored maximum negative voltage, and means to halt said motor when said gas filled electron discharge device conducts.

References Cited in the file of this patent

UNITED STATES PATENTS

| | | |
|---|---|---|
| 2,478,977 | Nicholson, Jr. | Aug. 16, 1949 |
| 2,565,876 | Nicholson, Jr. | Aug. 28, 1951 |